United States Patent [19]
Lasik et al.

[11] Patent Number: 4,670,347
[45] Date of Patent: Jun. 2, 1987

[54] RFI/EMI SHIELDING APPARATUS

[75] Inventors: Dennis Z. Lasik; Michael F. Roman, both of York, Pa.

[73] Assignee: Topflight Corp., York, Pa.

[21] Appl. No.: 838,762

[22] Filed: Mar. 12, 1986

[51] Int. Cl.[4] .................... B32B 15/08; H01F 1/00; H05K 9/00
[52] U.S. Cl. .................................. 428/458; 428/928; 428/901; 174/35 SM; 174/35 R; 174/35 SM
[58] Field of Search .......... 174/35 EA, 35 R, 35 MS; 428/458, 928

[56] References Cited

U.S. PATENT DOCUMENTS 4,381,421  4/1983  Coats et al. .................. 174/35 R
4,566,990  1/1986  Liu et al. ...................... 252/503
4,596,670  6/1986  Liu ............................... 252/511

Primary Examiner—John E. Kittle
Assistant Examiner—Patrick J. Ryan
Attorney, Agent, or Firm—Daniel J. O'Connor

[57] ABSTRACT

An article of manufacture, and process of producing same, which is utilized for the enhanced attenuation of circuit generated radio frequency and electromagnetic interference, i.e. RFI and EMI. The article of manufacture comprises a centrally disposed silver shielding conductive layer which captures circuit produced electromagnetic radiation and directs same to ground so that it does not affect the environment surrounding the electronic circuitry. The process of producing the article involves the silk screen printing of a silver-solvent compound onto a lower polyester-plastics material thus obviating the need for an adhesive between the silver conductive layer and the lower polyester material. The invention also includes the use of the particular article as a shield for the attenuation of circuit produced radiation.

2 Claims, 3 Drawing Figures

RFI/EMI SHIELDING APPARATUS

BACKGROUND OF THE INVENTION

This invention relates generally to an article of manufacture and process of using such article to shield the electronic noise or radiation emanating from electronic circuitry.

In applications where complex electronic circuits are utilized, the electronic noise generated by such circuits, i.e. the radio frequency/electromagnetic interference, may be of such a level as to be hazardous to nearby personnel or other electronic circuits. If such electronic noise reaches a high level, a unit may be judged unsafe by such governmental agencies as the Federal Communications Commission and be required to be recalled and redesigned by the manufacturer. It is apparent that such a recall will have a serious adverse effect on product sales.

One solution to the above problem, which has proven to be very costly to electronic circuit manufacturers, has been the redesign of circuit components to reduce RFI and EMI to acceptable levels. It has also been realized in the art that a foil shield, placed around the electronic circuitry and connected to ground, would be another effective means of reducing environmental radiation from electronic circuitry. Typically, an aluminum or copper foil is adhesively coated on both sides and an outer wrapping layer of polyester or plastics material is applied thereto.

Such aluminum and copper foil shielding uses, while somewhat effective, have proven to be somewhat costly to manufacture and, at least to some extent, not sufficiently durable for their intended use.

Accordingly, it is an object of the present invention to produce an RFI/EMI shielding device which is highly durable in the conditions of high temperature, humidity, salt and physical abuse present in many commercial applications.

It is a further object to produce an electromagnetic radiation shielding device which has enhanced conductive properties to more effectively direct the shielded radiation to electrical ground.

It is a further object to produce such a shielding device using a process which is less labor intensive, thus resulting in a shield product which may be sold at competitive commerical prices.

It is a still further object to produce an electrical interference shielding apparatus wherein the central shielding conductive layer cannot be separated from its protective plastics base layer, a condition which results in reduced performance of the apparatus. Such is accomplished by means of the novel process of the invention.

These and further objects and advantages of the present invention will become apparant as the following description proceeds, and the features of novelty characterizing the invention will be pointed out with particularity in the claims annexed to and forming a part of this specification.

PRIOR ART PATENTS

The most relevant prior art patents presently known to the inventors hereof are listed as follows: U.S. Pat. No. 4,208,696 issued to Lindsay et al on June 17, 1980; U.S. Pat. No. 4,308,568 issued to Whewell on Dec. 29, 1981; U.S. Pat. No. 4,424,900 issued to Petcavich on Jan. 10, 1984; U.S. Pat. No. 4,472,471 issued to Klein et al on Sept. 18, 1984; and U.S. Pat. No. 4,528,222 issued to Rzepecki on July 9, 1985.

From the particular art of the above-cited patents, it is apparent that it is broadly known to utilize a middle electrically conductive layer between outer plastic compound layers. It should be noted, however, that the above prior art structures are used for a highly specialized purpose, i.e. the discharge of electrostatic energy or static electricity which builds up in many industrial or office environments. Such use is in contrast to the present invention apparatus which is useful for the shielding of radio frequency and electromagnetic interference generated by electronic circuitry. The present invention is thus specifically designed to be utilized in a surrounding relationship to operational electronic systems in contrast to the prior art listed above.

Further, as noted in the above patents, the most commonly used conductive materials are carbon compounds primarily because of their low cost and ready availability. Carbon compounds are suitable as conductors in the electrostatic discharge field because a discharge time on the order of 5 to 10 seconds is acceptable. However, in the present inventive area, that of electronic radiation shielding, the shielding must take place in a matter of microseconds in order to effectively protect the environment from the electronic noise generated by operational circuitry. Thus, the prior art carbon compounds would not be suitable in the present context of RFI/EMI shielding.

It should be further noted that none of the above cited prior art patents teach the use of a silver conductive layer between outer polyester-plastics layers as is critical to the present invention.

The present invention further utilizes a novel process of producing a shielding apparatus which is not shown or suggested by the prior art.

BRIEF SUMMARY OF THE INVENTION

In the present invention, a primarily silver liquid solution compound is printed onto a base layer of polyester plastics material using silk-screening printing technology. The resulting layers are then cured and an adhesive layer is applied to the printed silver layer. An upper plastic protective layer is then applied to the adhesive layer.

The resulting shield apparatus is then die cut and appropriately scored and sized so that it may be placed in service around existing electronic circuitry.

The silver RFI/EMI shield apparatus of the present invention may be effectively utilized on smaller electronic items such as hand-held calculators. It may also be used in much larger industrial applications wherein the interference emanating from electronic circuitry may pose a major environmental hazard.

BRIEF DESCRIPTION OF THE DRAWING FIGURES

FULL DESCRIPTION OF THE PREFERRED EMBODIMENT

Figure 1:
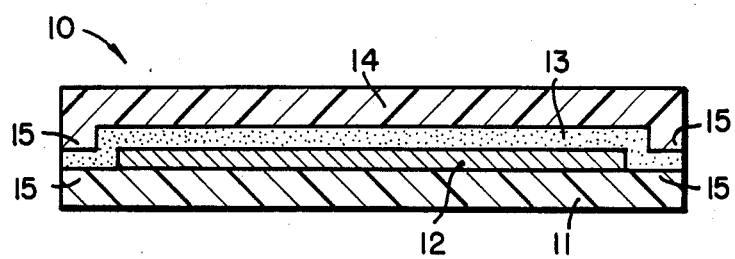
FIG. 1 illustrates the layered configuration of the shielding device in its final manufactured form ready for use.

As shown in FIG. 1, the silver RFI/EMI shield apparatus includes a lower polyester plastics layer 11 which, for example only and depending on the particular application, may be on the order of 0.005 inches in thickness. It is to be understood that this first lower layer 11 would be prestressed in known fashion to avoid shrinkage during the curing process step to be described hereinafter.

The layer 12 represents primarily precious silver metal which is applied by printing onto the lower plastics layer 11. The printing process used is that of silk screening, being widely known generally in the mechanical and printing arts. The significance of the use of the silk screen printing process in the present invention is that silver layer 12 is intimately joined with lower polyester layer 11 without the use of an adhesive so that no separation of the layers 11 and 12 occurs during use of the product. Thus, a longer life and more durable RFI/EMI shielding device is produced.

During the silk screen printing process, silver is applied in a commercially available ink form which includes appropriate binders and solvents. Nearly all of the silver ink binders and solvents are evaporated during a subsequent heat curing process step thus leaving a nearly pure precious silver conductive layer 12 which serves in use to capture electromagnetic radiation and direct it to electrical ground.

After curing of the combined layers 11 and 12, a suitable adhesive layer 13 is applied so that the upper polyester plastics layer 14 may be added. The thickness of the upper polyester plastic layer 14, depending on the particular application, may be on the order of 0.002 inches. Although not absolutely required in the invention, the layer 14 does serve the highly useful purpose of protecting the silver conductive layer 12 from damage in installation and use of the silver shield apparatus. Thus, layer 14 would normally be in contact with a housing of electronic circuitry to insure that the silver layer 12 is not directly contacted by any metal housing elements and can perform its ground conductive function properly.

The thickness of the finished product silver layer 12 may of course vary depending on the particular needs encountered but, for a typical application, would be on the order of 0.001 inches. It will therefore be appreciated that major thickness of the finished shielding apparatus is comprised of the inexpensive polyester plastics materials 11 and 14. A very thin and evenly applied silver layer 12 can thus be utilized with highly effective RFI/EMI shielding results.

One important advantage of the use of the silk screen printing of silver layer 12 is that sealed edge portions 15 may be more easily and accurately produced. If, for example, a foil layer were applied as the conductive layer 12, then more time consuming labor is required to achieve the edge seals 15. The silk screen printing of silver layer 12, on the other hand, allows a silver ink compound to be very accurately applied to the plastic base element 11 so that edges 15, being of necessity devoid of the conductive silver, are formed without the labor required in a coil conductor system.

Figure 2:
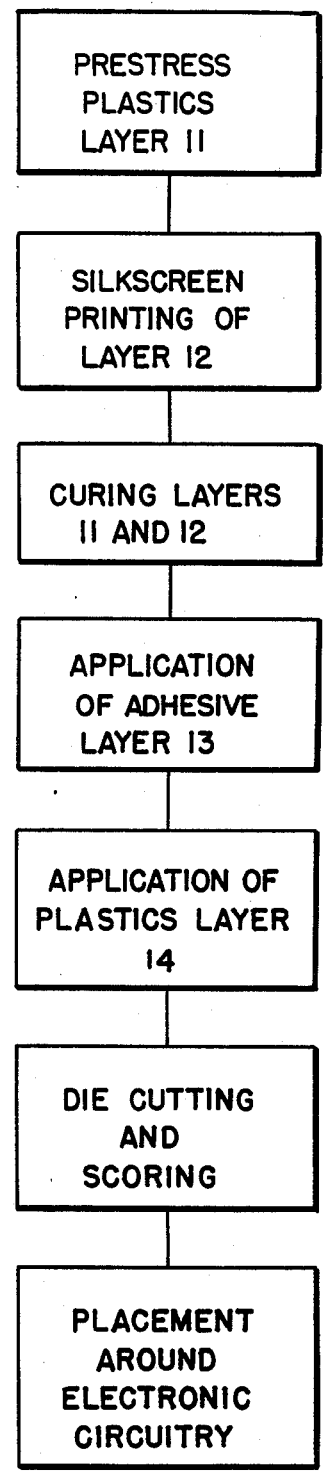
FIG. 2 shows the major process steps, in block diagram form, used in production of the electronic radiation shield of the present invention.

Shown in block diagram form in FIG. 2 are the seven primary process steps in creating the shielding apparatus of FIG. 1. Most of the process steps have been described above with reference to the layered apparatus. The process steps of critical importance to the present invention include the silk screen printing of the silver layer 12 onto the polyester plastic layer 11. An intimate and accurate placement of the silver conductive layer 12 onto plastics layer 11 is thus created. The combined layers 11 and 12 may then be appropriately heat cured and no potentially destructible adhesive layer is present between layers 11 and 12. Thus, in the finished product, no separation of layers 11 and 12 occurs thus making the shield apparatus much more durable in use.

Figure 3:
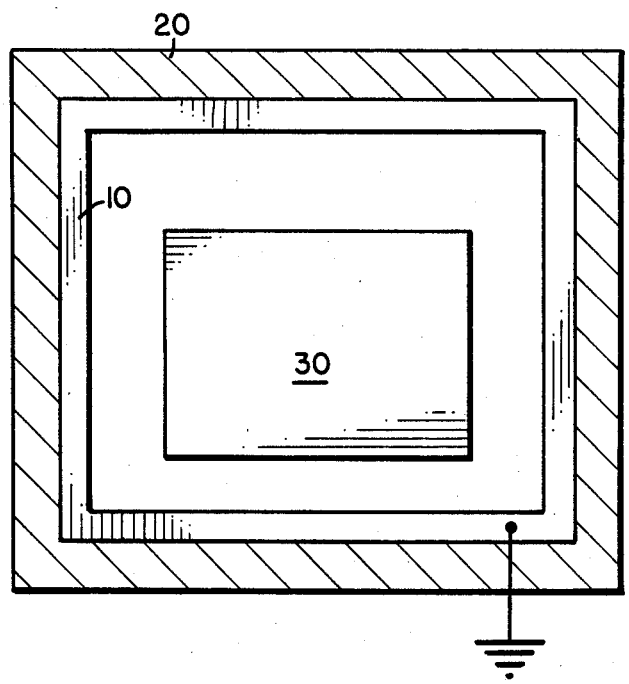
FIG. 3 illustrates the use of the silver shield of the present invention in association with electronic circuitry.

After the die cutting and scoring step to size the shield for a particular application, the shield is placed inside a housing 20 for operational electronic circuitry 30 as shown in FIG. 3. The silver layer 12 of shield 10 is of course connected to electrical ground as shown in FIG. 3.

The final process step, that of placing the produced shield 10 around operational electronic circuitry, is also critical to the present invention in the sense of being a novel use for a layered conductive element, especially one wherein a conductive layer 12 is applied via a silk screen printing process.

Preliminary test results on the shield apparatus of the present invention have demonstrated its remarkable durability in use. For example, the design has been tested under conditions wherein the electronic circuitry 30 was rendered inoperative yet the shield 10 remained in tact and highly functional as a RFI/EMI shielding device.

The invention insures that the manufacturer of housed electronic circuitry components will achieve maximum attenuation of electronically generated interference. Thus, units will not have to be recalled or taken off the market because of a potentially hazardous and increasingly important environmental condition.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

I claim:

1. A method of making an RFI/EMI shield means (10) for placement around operative electronic circuitry (30) and within a housing (20) which surrounds said electronic circuitry, said method comprising the following steps.
   (a) providing a prestressed lower polyester plastics layer (11),
   (b) applying a conductive layer of silver (12) to said lower polyester plastic layer by means of a silk screen printing process wherein said silver conductive layer (12) is applied to said lower polyester plastic layer (11) in liquid ink form which includes binders and solvents for use in the silk screen printing process,
   (c) curing by heat treatment the combined layers of polyester plastic (11) and conductive silver (12),
   (d) applying an adhesive layer (13) to said conductive silver layer (12),
   (e) applying an upper polyester plastic layer (14) to said adhesive layer (13) such that the conductive silver layer (12) is confined within the edge means (15) of said upper and lower polyester plastic layers (11, 14), (f) die cutting and scoring said shield means (10) so as to fit into a desired electronic housing (20), (g) installing said shield means (10) into said electonic housing (20) to reduce the harmful radiation emanating from said electronic circuitry when in operation, said silver conductive layer being connected to electrical ground.

2. An RFI/EMI shielding apparatus (10) for placement around operative electronic circuitry (30) and within a housing (20) which surrounds said electronic circuitry, said shielding apparatus (10) comprising:

a lower polyester plastics layer (11), a silver conductive layer (12) being printed onto said lower plastic layer (11) by means of a silk screen printing process, an adhesive layer (13) being superimposed on said silver conductive layer (12), an upper polyester plastics layer (14) being superimposed onto said adhesive layer (13) for protection of said silver conductive layer (12) upon placement in said electonic housing (20), means for electically grounding said silver conductive layer means (12) whereby harmful radiation emanating from said electronic circuitry (30) is captured and directed to ground to reduce the envitonmental impact of radiation emanating from said operational electronic circuitry (30), wherein said silver conductive layer (12) is confined within the edges (15) of said upper and lower polyester plastic layers (11, 14), said silver conductive layer being accurately deposited within the edges (15) of said lower plastic layer (11) by means of said silk screen printing process, wherein said silver conductive layer (12) is applied to said lower polyester plastic layer (11) in ink form including binders and solvents in the course of the silk screen printing application of said silver conductive layer (12) onto said lower plastic layer (11).

* * * * *